US007029989B2

United States Patent
Kim et al.

(10) Patent No.: US 7,029,989 B2
(45) Date of Patent: Apr. 18, 2006

(54) SEMICONDUCTOR DEVICE AND METHOD OF MANUFACTURING THE SAME

(75) Inventors: Nam Sik Kim, Goonpo-Shi (KR); Joo Han Shin, Cheongjoo-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 187 days.

(21) Appl. No.: 10/310,034

(22) Filed: Dec. 5, 2002

(65) Prior Publication Data
US 2004/0070023 A1    Apr. 15, 2004

(30) Foreign Application Priority Data
Oct. 14, 2002    (KR) .................... 10-2002-0062421

(51) Int. Cl.
*H01L 21/76* (2006.01)
*H01L 21/20* (2006.01)

(52) U.S. Cl. .................. 438/429; 438/430; 438/435; 438/479

(58) Field of Classification Search ........... 438/429, 438/430, 435, 479
See application file for complete search history.

(56) References Cited

U.S. PATENT DOCUMENTS

| 4,871,422 | A  | * | 10/1989 | Scardera et al. ............. 216/99 |
| 6,204,149 | B1 | * | 3/2001  | Batra et al. ................ 438/435 |
| 6,255,194 | B1 | * | 7/2001  | Hong ........................ 438/435 |
| 6,274,919 | B1 | * | 8/2001  | Wada ........................ 257/508 |
| 6,444,495 | B1 | * | 9/2002  | Leung et al. .............. 438/118 |
| 6,458,680 | B1 | * | 10/2002 | Chung et al. .............. 438/597 |
| 6,511,888 | B1 | * | 1/2003  | Park et al. ................ 438/296 |
| 6,541,343 | B1 | * | 4/2003  | Murthy et al. ............. 438/299 |
| 6,645,303 | B1 | * | 11/2003 | Frankel et al. ............ 118/725 |
| 6,683,364 | B1 | * | 1/2004  | Oh et al. .................. 257/510 |
| 2003/0019427 | A1 | * | 1/2003  | Ghanayem et al. ......... 118/712 |

FOREIGN PATENT DOCUMENTS

| KR | 990019740 | 5/1999  |
| KR | 000075235 | 12/2000 |
| KR | 010002746 | 1/2001  |

OTHER PUBLICATIONS

Hitoshi Wakabayshi, et al.: *A High-Performance 0.1 μm CMOS with Elevated Salicide using Novel Si-SEG Process;* 1997 IEEE; pp. 99-102.

B. W. Shen, et al,; *Scalability of a Trench Capacitor Cell for 64 MBIT DRAM;* 1989 IEEE; pp. 27-30.

* cited by examiner

*Primary Examiner*—Trung Dang
(74) *Attorney, Agent, or Firm*—Mayer, Brown, Rowe & Maw LLP

(57) ABSTRACT

The present invention relates to a semiconductor device and a method of manufacturing the same. The minimum marginal width of an impurity diffusion layer is defined to reduce by a given width. The reduced width of the impurity diffusion layer is compensated for through a silicon growth layer formed on the top of a device isolation film having a relatively higher degree of freedom than the bottom of the device isolation film. Thus, the degree of integration in the semiconductor device can be improved while keeping intact the minimum marginal width of the impurity diffusion layer.

7 Claims, 7 Drawing Sheets

CMP Process

Etch Process

SEMICONDUCTOR DEVICE AND METHOD OF MANUFACTURING THE SAME

BACKGROUND OF THE INVENTION

1. Field of the Invention

The invention relates generally to a semiconductor device and a method of manufacturing the same. More particularly, the invention relates to a semiconductor device comprising a device isolation film of a trench structure, and a method of manufacturing the same, which can solve reduction of an impurity diffusion layer while securing an insulating characteristic of the device isolation film, when the semiconductor device is higher integrated.

2. Description of the Prior Art

Recently, as the level of integration in the semiconductor device is increased, the length of a gate in a memory cell or a transistor is reduced. Also, the area and depth of the junction of an impurity diffusion layer, e.g. source/drain are reduced. Further, as the semiconductor device is higher integrated, the width and area of a device isolation region for electrically isolating neighboring devices, and a contact region for electrically connecting a lower layer and an upper layer are gradually reduced.

However, the level of integration in the semiconductor device is largely dependent on the manufacture equipments. Also, there is a limit in increasing the level of integration by reducing the area of only some portions of the semiconductor device (for example, gate, impurity diffusion layer or device isolation region) within the same technology. Therefore, there is a trend that the level of integration is not significantly increased but little by little increased within the minimum limit.

Generally, the semiconductor device is designed with the minimum design margin and the minimum design rule in order to satisfy the characteristic of the device within the same technology. Accordingly, it is very difficult to increase the level of integration by reducing only some portions of the semiconductor device (for example, gate, impurity diffusion layer or device isolation region). This is because other processes are made difficult as the area is reduced if the area in some portions of the semiconductor device is reduced.

For example, if the area of the impurity diffusion layer is simply reduced in order to increase the level of integration in the semiconductor device, the minimum design margin required to form the contact region is exceeded. It is thus difficult to secure the contact resistance and to satisfy the leakage current of the junction since the contact plug formed in the contact region is formed in the spacer formed at both sides of the device isolation region or the gate. In other words, as the contact region is reduced due to reduced area of the impurity diffusion layer, there is a mis-aligned phenomenon in a lithography process. Thus, the device isolation film formed in the device isolation region, for example, the device isolation film of the trench structure, etc. is etched by a STI (shallow trench isolation) process, thus increasing the leakage current of the junction. Meanwhile, if the device isolation region is reduced, there occurs a significant problem in the level of integration due to limited lithography technology. Also, as the device isolation region is formed exceeding the minimum design margin, there is a problem that the insulating characteristic of the device isolation film is degraded.

SUMMARY OF THE INVENTION

The present invention is contrived to solve the above problems and an object of the present invention is to provide a semiconductor device capable of improving the level of integration in the semiconductor device while securing an insulating characteristic of a device isolation film formed in a device isolation region of the semiconductor device.

Another object of the present invention is to provide a semiconductor device that can secure the area of an impurity diffusion layer same to the state of the art while improving the level of integration in the semiconductor device, by reducing the area of a region where the impurity diffusion layer will be formed.

Still another object of the present invention is to provide a method of manufacturing a semiconductor device capable of securing an insulating characteristic of a device isolation film and compensating for the area of the impurity diffusion layer that is reduced to increase the level of integration in the semiconductor device. To this end, the width of the bottom of the device isolation film having a trench structure is made to be same to that of the device isolation film according to the state of the art. Also, silicon is grown on an upper inner sidewall of the device isolation film by means of a SEG (selective epitaxial growth) process.

In order to accomplish the above objects, the semiconductor device according to the present invention, is characterized in that it comprises a semiconductor substrate, a gate formed on the semiconductor substrate, an impurity diffusion layer formed in the semiconductor subset at both sides of the gate, wherein the impurity diffusion layer serves as source and drain, a device isolation film of a trench structure for electrically isolating neighboring impurity diffusion layers, wherein the device isolation film has at least one insulating film, and a silicon growth layer formed between the device isolation film and the semiconductor substrate at an upper portion of the device isolation film, wherein the same impurity to the impurity diffusion layer is injected into the silicon growth layer so that the impurity diffusion layer has a structure that is extended by the silicon growth layer.

Further, the method of manufacturing the semiconductor device according to the present invention, is characterized in that it comprises the steps of forming a trench in a semiconductor substrate, forming a first insulating film so that the trench is buried by a given depth, performing a SEG process for the semiconductor substrate exposed at both sidewalls of the trench to form a silicon growth layer, and forming a second insulating film on the first insulating film so that the trench is buried.

In addition, the method of manufacturing the semiconductor device according to the present invention, is characterized in that it comprises the steps of forming a pad nitride film in semiconductor substrate, etching portions of the pad nitride film and the semiconductor substrate to form a trench, depositing an insulating film on the entire structure so that the trench is buried, polishing the insulating film so that the pad nitride film is exposed, removing the pad nitride film by performing an etch process using an etch rate of the pad nitride film and the insulating film, performing a cleaning process for the insulating film to form a moat of a given depth between the nitride film and the semiconductor substrate, and performing a SEG process for the semiconductor substrate exposed at the moat to form a silicon growth layer.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
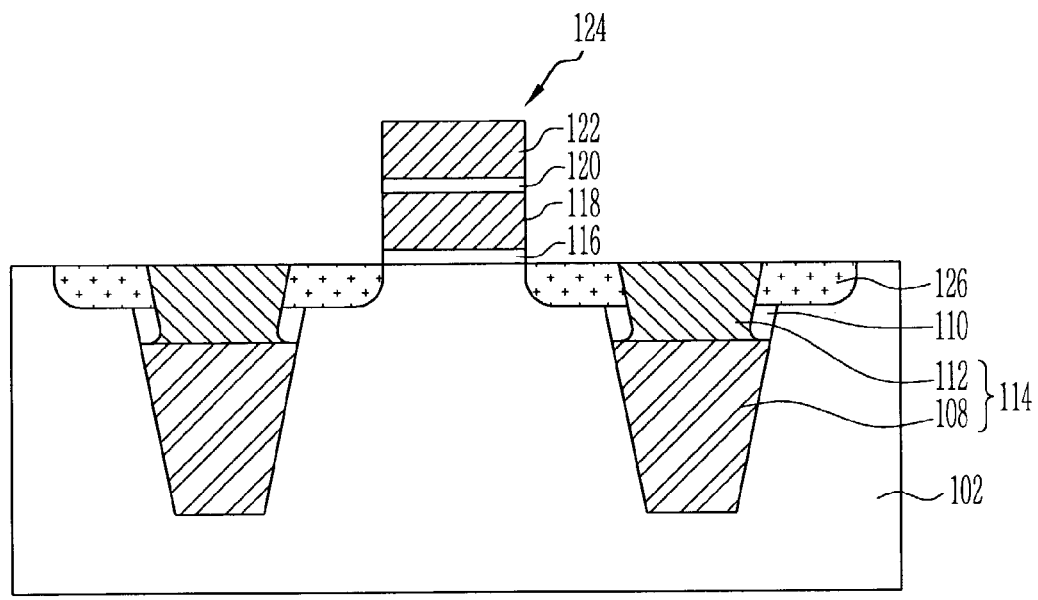
FIG. 1 is a cross sectional view of a semiconductor device according to a first embodiment of the present invention.

The present invention will be described in detail by way of a preferred embodiment with reference to accompanying drawings, in which like reference numerals are used to identify the same or similar parts.

FIG. 1 is a cross sectional view of a semiconductor device according to a first embodiment of the present invention.

Referring now to FIG. 1, the semiconductor device according to the first embodiment of the present invention comprises a plurality of impurity diffusion layers 126 serving as source/drain, and a plurality of gates 124. The semiconductor device further comprises a device isolation film 114 for electrically isolating single devices (for example, unit cell, transistor) consisting of the impurity diffusion layer 126 and the gates 124.

The impurity diffusion layer 126 is formed in the semiconductor substrate 102 at both sides of the gates 124. One end of the impurity diffusion layer 126 adjoins the gates 124. The other end of the impurity diffusion layer 126 is extended to a silicon growth layer 110 formed in a device isolation region where the device isolation film 114 is formed. At this time, for convenience of explanation, it is shown that the impurity diffusion layer 126 is experienced only by a low-concentration ion implantation process. However, it should be noted that the impurity diffusion layer 126 may be formed to have a LDD (lightly doped drain) structure through a gate spacer process and a high-concentration ion implantation process.

The device isolation film 114 is formed to have the trench structure through a STI (shallow trench isolation) process, i.e. a two-layer structure on which the insulating films are stacked. In more detail, the device isolation film 114 comprises an insulating film 108 (hereinafter called 'first insulating film') formed at a lower side of the trench, and an insulating film 112 (hereinafter called 'second insulating film') formed on the first insulating film 108.

The first insulating film 108 serves to maintain the width of the lower portion of the trench to the minimum design margin, so that an electrical insulating characteristic of the device can be secured. The first insulating film 108 may be formed using one of a SOG (spin on glass) oxide film of a family of HSQ (hydrogen silses quioxane), a HDP (high density plasma) oxide film, a BPSG (boron phosphorous silicate glass) oxide film, an USG (undoped silicate glass) oxide film, a PSG (phosphorus silicate glass) oxide film or a PETEOS (plasma enhanced tetra ethyl ortho silicate glass) oxide film, or the like.

Further, the second insulating film 112 may be formed using one of the same oxide films as described by reference to the first insulating film 108. Also, the second insulating film 112 may be formed with the same method used to form the first insulating film 108. However, it should be understood that their process conditions may vary a little. The first insulating film 108 serves to maintain the width of the lower portion of the trench to the minimum design margin in order to prevent a breakdown phenomenon that may occur between well regions (not shown) of the semiconductor substrate 102. The second insulating film 112 located on the first insulating film 108 functions to electrically isolate the single devices.

The silicon growth layer 110 is formed by performing a SEG (selective epitaxial growth) process for an upper inner sidewall of the trench, e.g. a portion of the semiconductor substrate 102 exposed through the trench. A portion or the entire portions of the silicon growth layer 110 into which a given ion (for example, boron or phosphorous) is implanted by means of a low-concentration or a high-concentration ion implantation process serves or serve as the impurity diffusion layer. Accordingly, the impurity diffusion layers 126 are extended to the silicon growth layer 110 of the device isolation film region.

The gate 124 comprises a gate insulating film 116, a floating gate 118, a dielectric film 120 and a control gate 122. It should be noted that this structure represents a cell structure of the flash memory device as an example but the gate of the present invention is not limited to this structure. In other words, the gate in the present invention can be applied to all the gate structures of the semiconductor device in which the device isolation film 114 is used.

Figure 2:
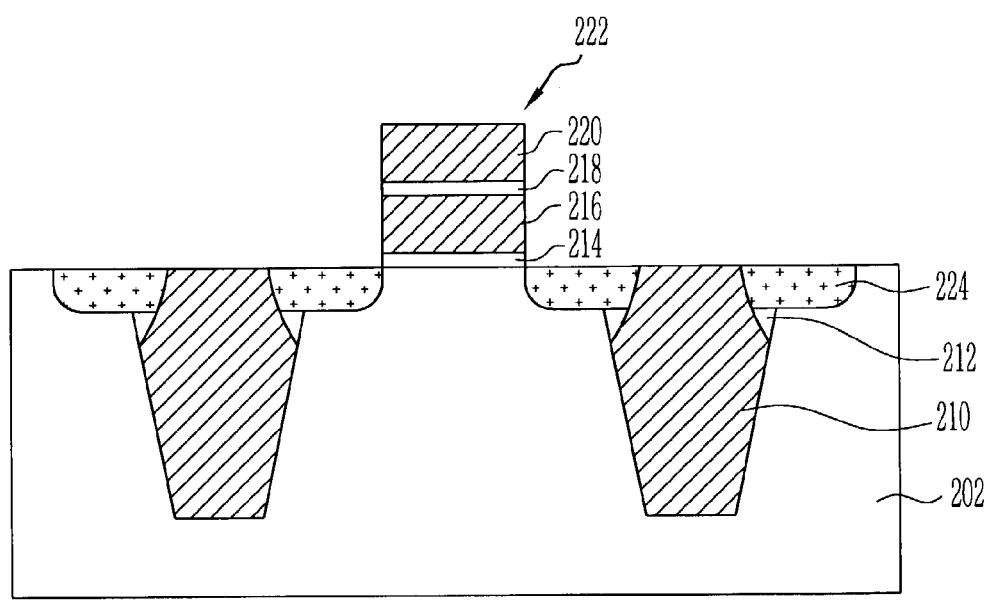
FIG. 2 is a cross sectional view of a semiconductor device according to a second embodiment of the present invention.

The present invention is not limited to the semiconductor device according to the first embodiment but the present invention can be variously implemented depending on the structure of the device isolation film as shown in FIG. 2.

FIG. 2 is a cross sectional view of a semiconductor device according to a second embodiment of the present invention.

In the second embodiment of the present invention, the number of the process can be reduced compared to those in the first embodiment, by applying the technical idea of the first embodiment of the present invention to a moat portion of the sidewall of the trench generating after the device isolation film is formed.

Referring now to FIG. 2, the semiconductor device according to the second embodiment comprises a plurality of impurity diffusion layers 224, a plurality of gates 222, an impurity diffusion layer 224, and a device isolation film 210 of a trench structure that is formed using the STI process in order to electrically isolate the single devices consisting of the gates 222, as in the first embodiment. The gate 222 comprises a gate insulating film 214, a floating gate 216, a dielectric film 218 and a control gate 220.

It was described that the device isolation film 114 in the first embodiment includes the first insulating film 108 and the second insulating film 112 as shown in FIG. 1. However, the device isolation film 210 in the second embodiment includes a single insulating film. In other words, in the second embodiment, the device isolation film 210 of a single insulating film is formed to reduce the number of the process for manufacturing the semiconductor device.

The device isolation film 210 may be formed using the SOG oxide film of a family of HSQ, the HDP oxide film, the BPSG oxide film, the USG oxide film, the PSG oxide film, the PETEOS oxide film, etc. The oxide films may be adequately selected depending on the manufacture process. In particular, the oxide films can be adequately selected considering the CMP process that is additionally necessarily performed in view of each of the oxide films At this time, the silicon growth layer 212 is formed as follow. The device isolation film 210 is formed. The process conditions (for example, etch time, etch solution) when an etch process for etching the device isolation film 210 is performed is controlled to artificially form a moat (or recess) so that the semiconductor substrate 202 is exposed toward both sides of the trench. The SEG process is then performed for the exposed portion. The detailed method of forming the silicon growth layer 212 will be described later.

The technical characteristics between the semiconductor devices according to the first and second embodiments and the conventional semiconductor device will be compared. For convenience of explanation, only the semiconductor device according to the first embodiment will be explained.

Figure 3A:
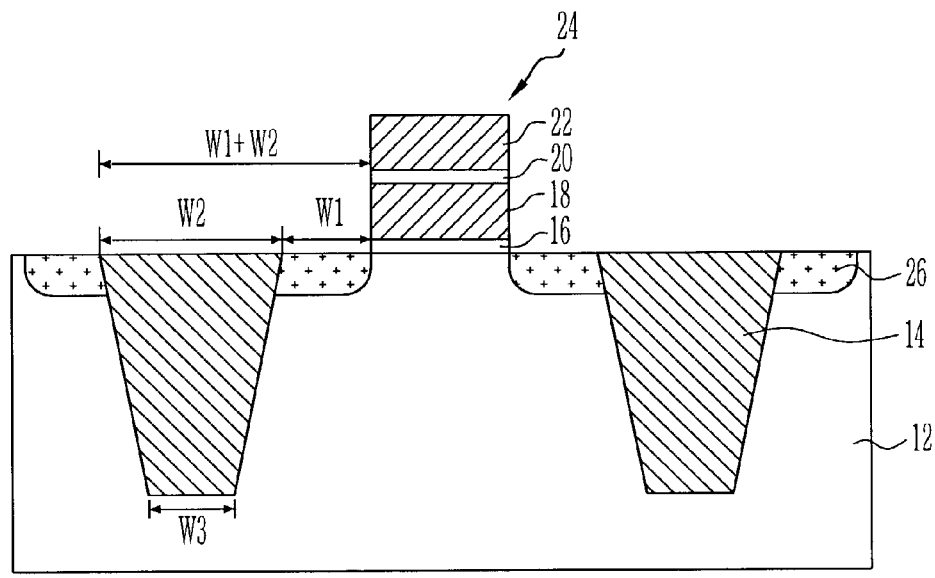
FIG. 3A is a cross sectional view of a conventional semiconductor device for explaining the technical characteristics of the device according to the state of the art.
Figure 3B:
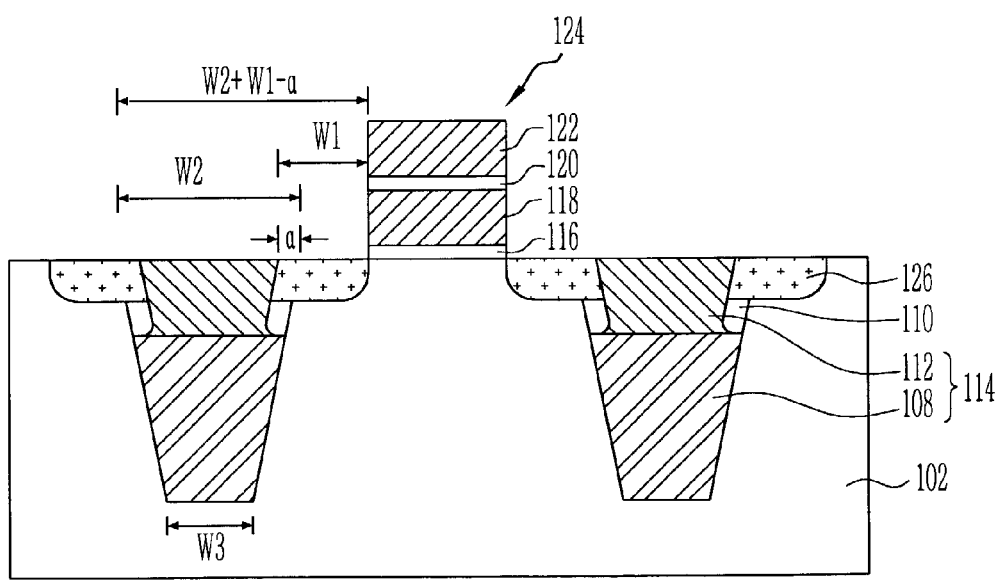
FIG. 3B is a cross sectional view of the semiconductor device for explaining the technical characteristics of the device according to the first embodiment shown in FIG. 1.

FIG. 3A is a cross sectional view of the conventional semiconductor device and FIG. 3B is a cross sectional view of the semiconductor device according to the first embodiment of the present invention. At this time, 'W1' is a width of the impurity diffusion layer, 'W2' is a width of the top of the device isolation film and 'W3' is the minimum marginal width of the device isolation film.

In the conventional semiconductor device, it can be seen that the sum of the width 'W1' of the impurity diffusion layer 26 and the width 'W2' of the top of the device isolation film 14 is 'W1'+W2', as shown in FIG. 3A. On the contrary, in the semiconductor device according to the first embodiment, it can be seen that the width 'W1' of the impurity diffusion layer 126 and the width 'W2' of the top of the device isolation film 114 is 'W2'+'W1'−'α' (where 'α' is the width of the silicon growth layer), as shown in FIG. 3B. Also, it can be seen that the widths 'W3' of the bottom of the device isolation films 14 and 114 are same both in the conventional and present semiconductor devices.

As such, if the semiconductor device according to the first embodiment is used, the sum width of the impurity diffusion layer 126 and the device isolation film 114 can be reduced by a while keeping the width 'W3' of the bottom of the device isolation film 114 same to the state of the art.

Generally, in the device isolation film of the trench structure, the width 'W3' of the bottom of the trench greatly affects the insulating characteristic 20 than the width 'W2' of the top of the trench. Considering this, in designing the semiconductor device, the width 'W3' of the bottom of the trench is firstly decided than the width 'W2' of the top of the trench. Also, the width 'W3' of the bottom of the trench must be formed within the minimum marginal width. At this time, the width 'W2' of the top of the trench is decided depending on the width 'W3' of the bottom considering higher-integration by means of the STI process. It can be said that the width 'W2' of the top of the trench has a higher degree of freedom than the width 'W3' of the top in the design.

Therefore, the present invention employs a technical idea that the width of the top of the device isolation film having a high degree of freedom is adequately controlled while keeping intact the width of the bottom of the device isolation film. In more concrete, in the present invention, the trench the width of which is reduced by 'α' than the minimum marginal width 'W1' of the impurity diffusion layer 126 is formed. The silicon growth layer 110 having the thickness of 'α' is then formed on the top inner sidewall of the trench. Next, an impurity is injected into the active region of the semiconductor substrate 102 in which the impurity diffusion layer 126 will be formed and the silicon growth layer 110, thus forming an impurity diffusion layer 126. Thereby, the final impurity diffusion layer 126 has a width of W1. In other words, in the present invention, the width 'W1' of the impurity diffusion layer 126 is designed by reducing it by 'α'. The width 'W1' of the impurity diffusion layer that is reduced by 'α' is compensated for through the silicon growth layer 110 of the device isolation region having a relatively high degree of freedom.

A method of manufacturing the semiconductor devices according to the embodiments of the present invention will be below described. Reference numerals in the respective drawing are same to those used in FIG. 1 or FIG. 2.

FIG. 4A through FIG. 4G are cross sectional views of the semiconductor devices for explaining the method of manufacturing the device shown in according to the first embodiment of the present invention. For simplicity, an explanation will be given until the process of forming the device isolation film.

Figure 4A:
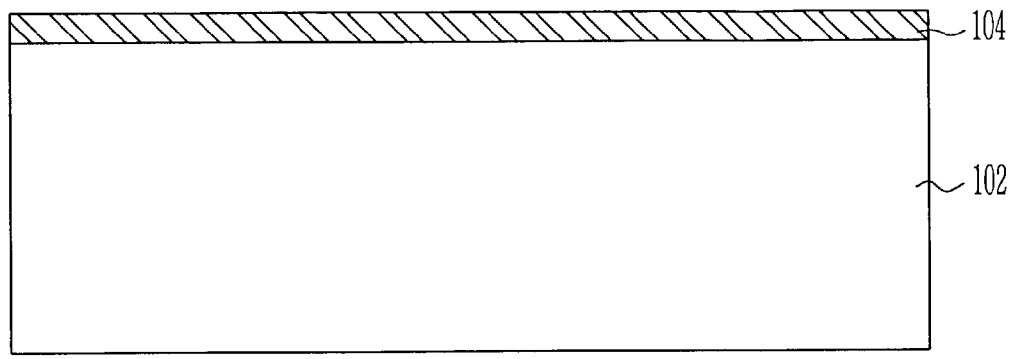
FIG. 4A through FIG. 4G are cross sectional views of the semiconductor devices for explaining a method of manufacturing the device shown in FIG. 1 according to the first embodiment of the present invention.

Referring now to FIG. 4A, a semiconductor substrate 102 that is cleaned by a pre-cleaning process is prepared. At this time, it is preferred that the pre-cleaning process includes using DHF (diluted HF; HF solution in which $H_2O$ is diluted at the ratio of 50:1), using SC-1 (solution in which a $NH_4OH/H_2O_2/H_2O$ solution is mixed at a given ratio) or BOE (buffer oxide etchant; mixed solution [1:4 through 1:7] of HF in which $H_2O$ is diluted and $NH_4F$ at the ratio of 100:1 or 300:1, and then using SC-1.

A pad nitride film 104 is then formed on the semiconductor substrate 102 cleaned by the pre-cleaning process. The pad nitride film 104 is formed by a deposition method of a LPCVD (low-pressure chemical vapor deposition) mode. At this time, it is preferred that the pad nitride film 104 is formed in thickness of 900 through 2000 Å considering the level of integration and reliability of the semiconductor device.

Meanwhile, in order to remove crystal defects on the surface of the semiconductor substrate 102 and to process the surface of the substrate 102, a pad oxide film (now shown) of 70 through 100 Å in thickness may be formed between the semiconductor substrate 102 and the pad nitride film 104 by performing an oxidization process of a dry or a wet oxidization mode at a temperature of 750 through 800° C.

Figure 4B:
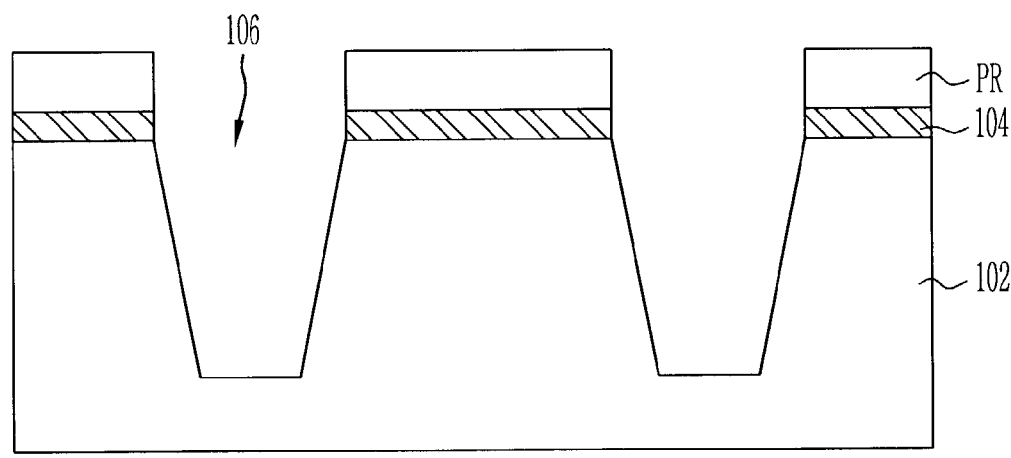

By reference to FIG. 4B, a trench 106 is formed so that a region where the impurity diffusion layer will be formed is defined, wherein the impurity diffusion region is narrowly formed by difference between a target width of an impurity diffusion layer (not shown) and the width of a silicon growth layer (see 110 in FIG. 4D) in the device isolation film region. For example, if the impurity diffusion layer is formed between a device isolation film 114 and a gate (not shown), the trench 106 is formed moved toward the gate by a thickness of a silicon growth layer 110. A method of forming the trench 106 will be later described.

A photoresist (not shown) is coated on the entire structure. An exposure process using the photo mask and a development process are then performed to form a photoresist pattern PR having a profile of the subsequent trench 106.

Next, an etch process using the photoresist pattern PR is performed to etch a portion of the semiconductor substrate 102 including the pad nitride film 104 by a given depth, thus forming the trench 106. At this time, it is preferred that an inner tilt surface of the trench 106 has an angle of 65 through 85°. Also, it is preferable that the photoresist pattern process and the etch process are adequately controlled so that the width of the bottom of the trench 106 can be formed within the minimum marginal width range.

Thereafter, the photoresist pattern PR is removed by a given strip process.

Figure 4C:
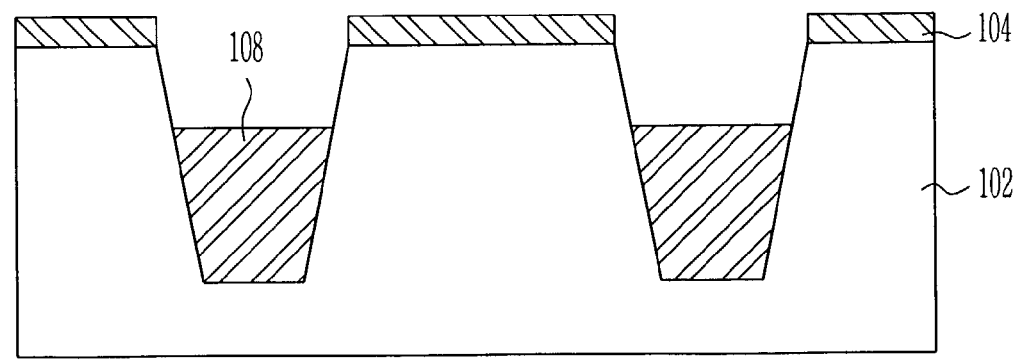

Referring to FIG. 4C, a first insulating film 108 is formed by which the trench 106 is buried to a given depth. At this time, it is preferred that the first insulating film 108 is formed using the SOG oxide film of a family of HSQ, the HDP oxide film, the BPSG oxide film, the USG oxide film, the PSG oxide film, the PETEOS oxide film, or the like.

As the SOG oxide film of a family of HSQ has a good hole gap fill characteristic, additional CMP process and etch processes are not required unlikely from other oxide films. At this time, additional wet etch process using DHF or BOE solution may be performed in order to remove remaining SOG oxide film that may remain on the inner sidewall (i.e. exposed sidewall) of the trench 106 after the SOG oxide film of a family of HSQ is coated by a coating method. In more detail, it is preferred that the SOG oxide film is deposited by means of the coating method, wherein fluidity oxide (for example, FOX14, FOX15) is used as a coating source liquid and the rotation force upon the coating is about 1500 through 3000 rpm. In the above, FOX14 and FOX15 are the product names of a family of the fluidity oxide film.

Figure 6A:
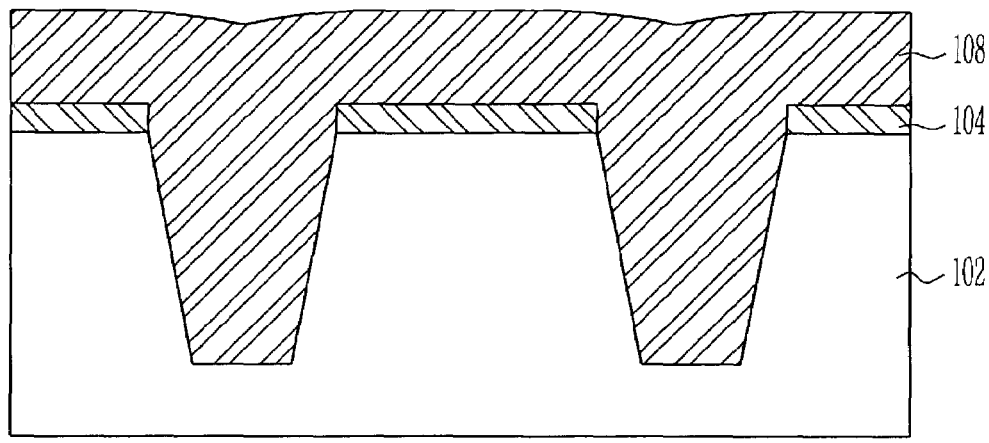
FIG. 6A through FIG. 6C are cross sectional views of the semiconductor devices for explaining a method of manufacturing the first insulating film or the second insulating film shown in FIG. 4C or FIG. 4E.
Figure 6B:
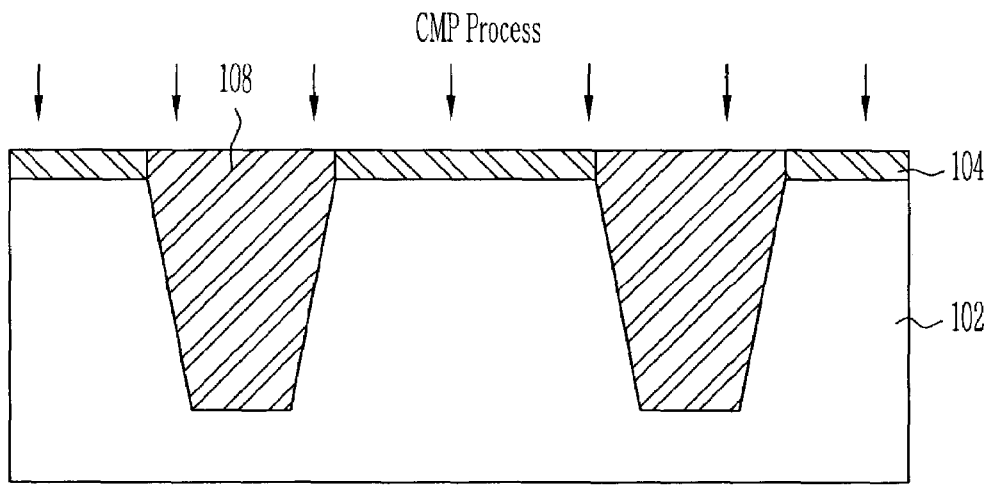
Figure 6C:
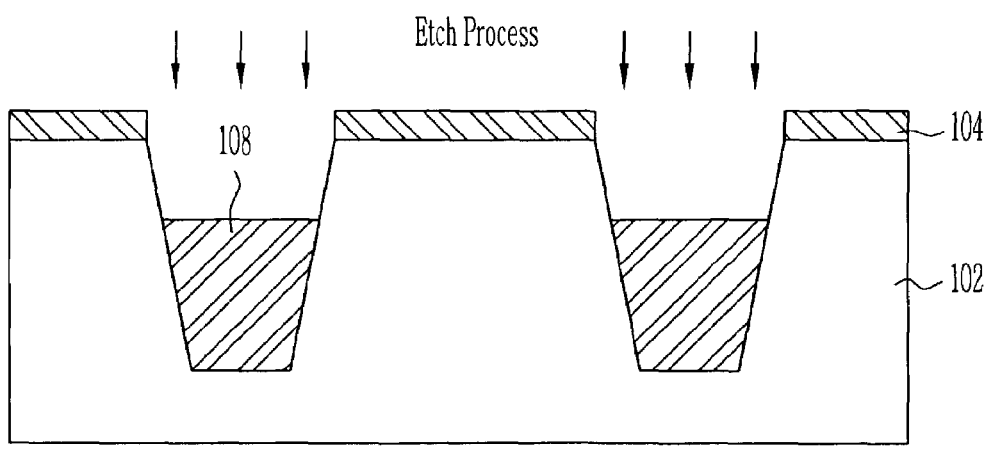

The HDP oxide film, the BPSG oxide film, the USG oxide film, the PSG oxide film or the PETEOS oxide film have poor hole gap fill characteristics than the SOG oxide film of a family of HSQ. Thus, the CMP process and the etch process or the etch process must be additionally performed as shown in FIG. 6A through FIG. 6C. In the present invention, the method of performing the CMP process and the wet etch process will be described as an example.

Referring to FIG. 6A, the first insulating film 108 made of the HDP oxide film, the BPSG oxide film, the USG oxide film, the PSG oxide film or the PETEOS oxide film is deposited on the entire structure so that the trench 106 is buried.

The HDP oxide film is deposited using $SiH_4$, $O_2$ and Ar gas or $SiH_4$, $O_2$ and He gas as a source gas at a temperature of about 400 through 700° C. and low pressure of several dozens through several hundreds μtorr.

The BPSG oxide film is deposited by performing the CVD (chemical vapor deposition) method having a concentration ratio of boron (B) and phosphorus (P) of 12:4 through 13:6 at a temperature of 400 through 500° C.

The USG oxide film is deposited using TEOS (tetra-ethyl-orthosilicate) and $O_3$ gas at a low temperature of 400 through 600° C. without using plasma.

By reference to FIG. 6B and FIG. 6C, the first insulating film 108 is polished by the CMP process so that the pad nitride film 104 is exposed. Next, the first insulating film 108 is over etched by the wet etch method, thus exposing the semiconductor substrate 102 at both sides of the trench 106.

Figure 4D:
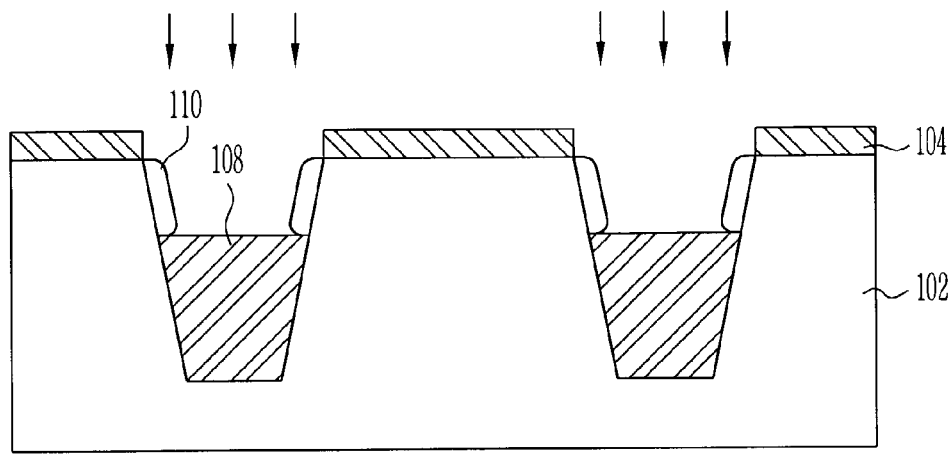

Referring now to FIG. 4D, silicon of the semiconductor substrate 102 that was exposed at both sides of the trench 106 is grown by the SEG process, thus forming a silicon growth layer 110. The SEG process is performed using DCS ($SiH_2Cl_2$) gas and HCl gas, wherein the amount of the DCS ($SiH_2Cl_2$) gas introduced is 100 through 300 sccm, the amount of the HCl gas introduced is 20 through 80 sccm, a deposition pressure is 10 through 40 torr and a temperature is 700 through 900° C.

Figure 4E:
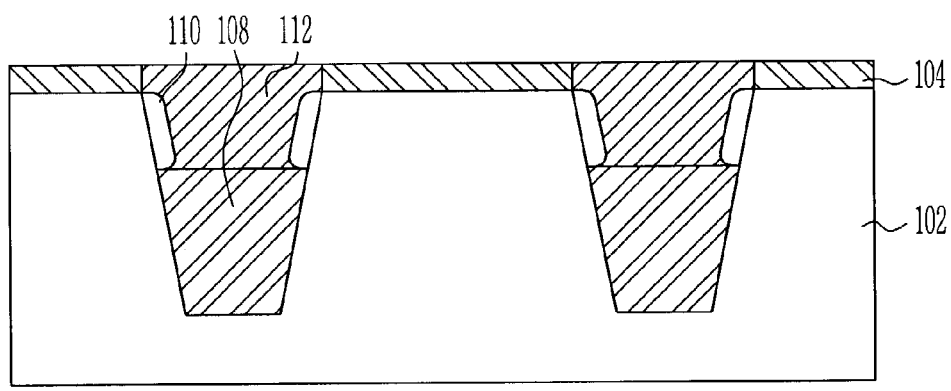

By reference to FIG. 4E, a second insulating film 112 is formed on the first insulating film 108 so that the trench 106 is completely buried. The second insulating film 112 is formed using the SOG oxide film of a family of HSQ, the HDP oxide film, the BPSG oxide film, the USG oxide film, the PSG oxide film, the PETEOS oxide film, or the like, same in the first insulating film 108. A deposition method of the respective oxide film is same to those of the first insulating film 108. However, the CMP method may include performing any one of the CMP method, the wet method and the dry method, or a combination of the CMP method, and the wet method or the dry method, as shown in FIG. 6B or FIG. 6C. As the detailed explanation on them was made by reference to FIG. 6B and FIG. 6C, it will be omitted in this context.

Figure 4F:
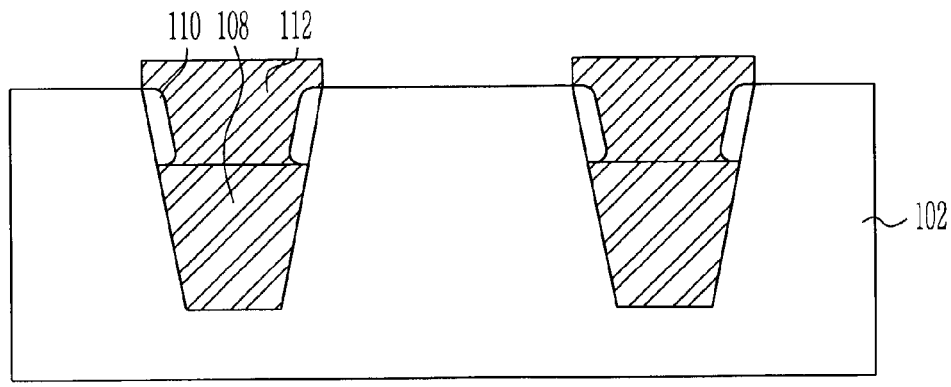

Referring now to FIG. 4F, the pad nitride film 104 except for the second insulating film 112 is removed by a cleaning process using the semiconductor substrate 102 as an etch barrier. At this time, it is preferred that the cleaning process is performed using a cleaning solution such as phosphoric acid ($H_3PO_4$), sulfuric acid ($H_2SO_4$), or the like.

Meanwhile, in order to remove the second nitride film 112 that may remain on the pad nitride film 104, a cleaning process using HF or BOE may be performed before the pad nitride film 104 is removed.

Figure 4G:
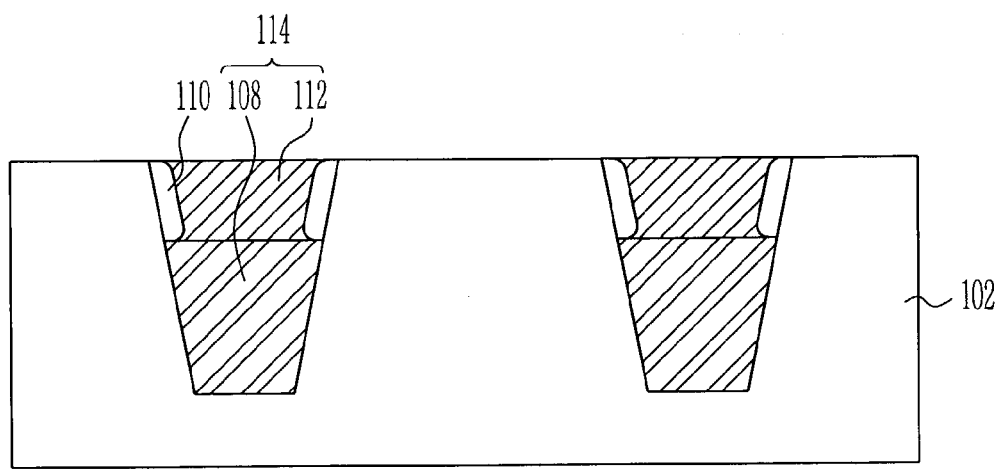

Referring now to FIG. 4G, a protruded portion of a nipple shape in the second insulating film 112 is removed by performing the etch process, for example, the wet or the dry mode, the CMP process or the cleaning process. Thereby, the device isolation film 114 including the first insulating film 108 and the second insulating film 112 is formed.

Subsequent processes are same to the typical processes. Thus, an explanation of them will be omitted for convenience of explanation.

In FIG. 4G, after the device isolation film 114 is formed, the gate 124 including the gate insulating film 116, the floating gate 118, the dielectric film 120 and the control gate 122 is formed in the active region of the semiconductor substrate 102 (except for a region in which the impurity diffusion layer will be formed), as shown in FIG. 1.

Next, an ion implantation process is performed for the semiconductor substrate 102 and the silicon growth layer 110 that are exposed toward both sides of the gates 124 in the active region, thus forming the impurity diffusion layer (see 126 in FIG. 1) is formed. At this time, a method of forming the impurity diffusion layer 126 having a LDD structure will be described as an example.

First, an ion implantation mask is formed so that the top of the semiconductor substrate 102 and the silicon growth layer 110 that are exposed toward both sides of the gate 124 in the active region. At this time, the ion implantation mask is the photoresist pattern that was formed by sequentially performing the exposure process using the photoresist and the etch process.

Thereafter, a low-concentration ion implantation process using the ion implantation mask is performed for the semiconductor substrate 102 and the silicon growth layer 110 at both sides of the gate 124, thus forming a low-concentration impurity diffusion layer (not shown). At this time, the low-concentration impurity diffusion layer may be formed before the gate 124 is formed.

Next, a spacer (not shown) is formed at both sidewall of the gate 124. A high-concentration ion implantation process using the ion implantation mask including the spacer is then performed to form a high-concentration impurity diffusion layer (not shown) that is deeper than the low-concentration impurity diffusion layer. Thereby, the impurity diffusion layer of the LDD structure including the low-concentration impurity diffusion layer and the high-concentration impurity diffusion layer is completed.

FIG. 5A through FIG. 5E are cross sectional views of the semiconductor devices for explaining a method of manufacturing the device according to the second embodiment of the present invention. For simplicity, an explanation will be made until the process of forming the device isolation film.

Figure 5A:
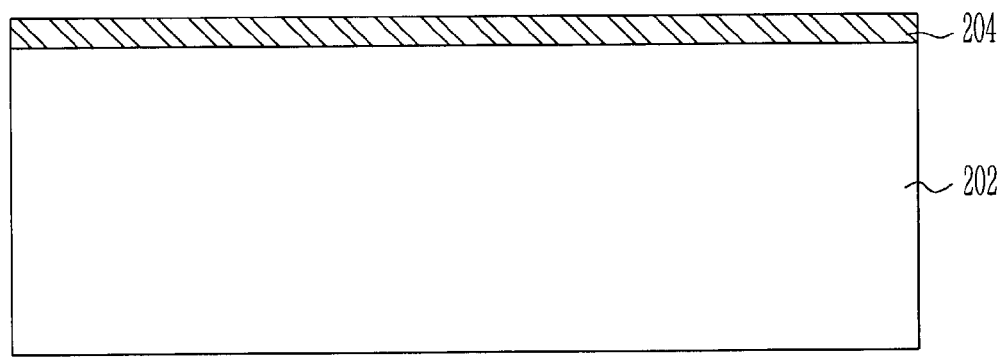
FIG. 5A through FIG. 5E are cross sectional views of the semiconductor devices for explaining a method of manufacturing the device shown in FIG. 2 according to the second embodiment of the present invention.

Referring now to FIG. 5A, a semiconductor substrate 202 that is cleaned by a pre-cleaning process is prepared. At this time, it is preferred that the pre-cleaning process includes using DHF (diluted HF; HF solution in which $H_2O$ is diluted at the ratio of 50:1), using SC-1 (solution in which a $NH_4OH/H_2O_2/H_2O$ solution is mixed at a given ratio) or BOE (buffer oxide etchant; mixed solution [1:4 through 1:7] of HF in which $H_2O$ is diluted and $NH_4F$ at the ratio of 100:1 or 300:1, and then using SC-1.

A pad nitride film 204 is then formed on the semiconductor substrate 202 cleaned by the pre-cleaning process. The pad nitride film 204 is formed by a deposition method of a LPCVD (low-pressure chemical vapor deposition) mode. At this time, it is preferred that the pad nitride film 104 is formed to be thick by maximum, considering the level of integration and reliability of the semiconductor device. This is to for the purpose of forming the protrusion of a nipple shape of the device isolation film (see 210 in FIG. 5D) to be thick by maximum so that the dip time becomes longer when the cleaning process or the wet etch process by which the moat is formed at a portion 'A' in FIG. 5D, Meanwhile, in order to remove crystal defects on the surface of the semiconductor substrate 202 and to process the surface of the substrate 202, a pad oxide film (now shown) of 70 through 100 Å in thickness may be formed between the semiconductor substrate 202 and the pad nitride film 204 by performing an oxidization process of a dry or a wet oxidization mode at a temperature of 750 through 800° C.

Figure 5B:
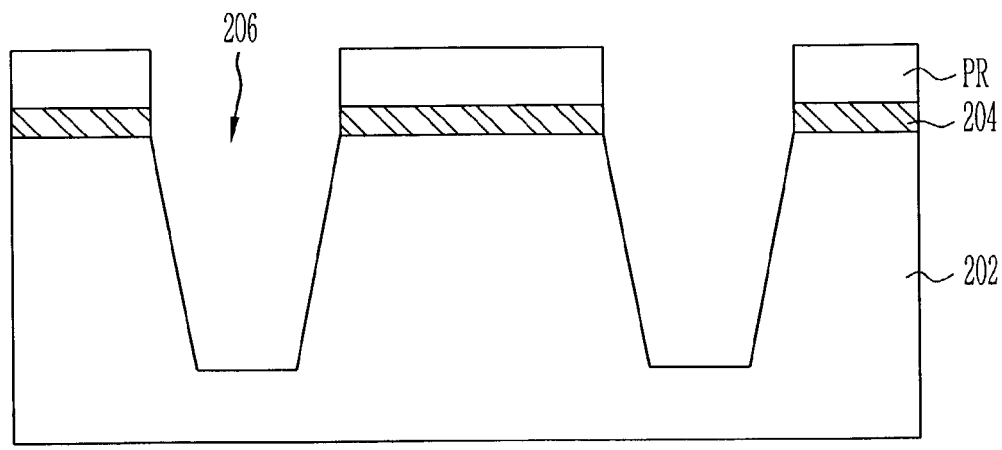

By reference to FIG. 5B, a trench 206 is formed so that a region where the impurity diffusion layer will be formed is defined, wherein the impurity diffusion region is narrowly formed by difference between a target width of an impurity diffusion layer (not shown) and the width of a silicon growth layer (see 212 in FIG. 5E) in the device isolation film region. For example, if the impurity diffusion layer is formed between a device isolation film 210 and a gate (not shown), the trench 206 is formed moved toward the gate by a thickness of a silicon growth layer 212. A method of forming the trench 206 will be later described.

A photoresist (not shown) is coated on the entire structure. An exposure process using the photo mask and a development process are then performed to form a photoresist pattern PR having a profile of the subsequent trench 206.

Next, an etch process using the photoresist pattern PR is performed to etch a portion of the semiconductor substrate 202 including the pad nitride film 204 by a given depth, thus forming the trench 206. At this time, it is preferred that an inner tilt surface of the trench 206 has an angle of 65 through 85°. Also, it is preferable that the photoresist pattern process and the etch process are adequately controlled so that the width of the bottom of the trench 206 can be formed within the minimum marginal width range.

Thereafter, the photoresist pattern PR is removed by a given strip process.

Figure 5C:
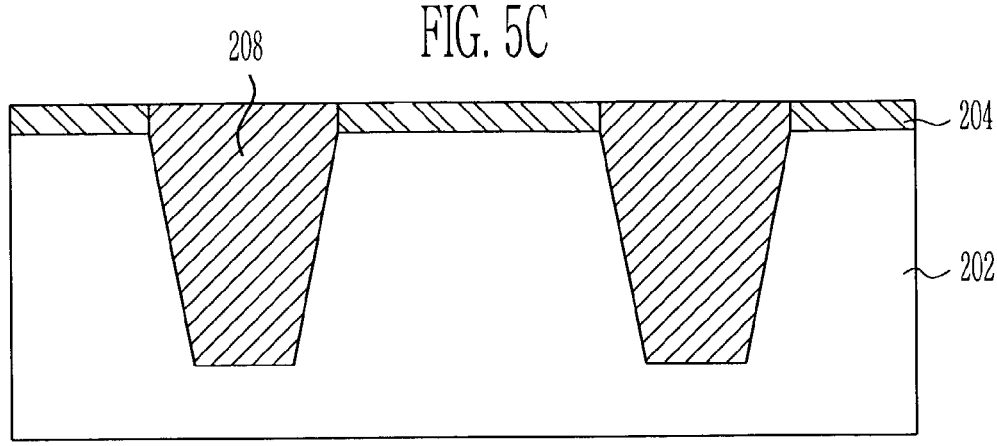

Referring to FIG. 5C, a single insulating film 208 is formed by which the trench 206 is buried to a given depth. At this time, it is preferred that the single insulating film 208 is formed using the SOG oxide film of a family of HSQ, the HDP oxide film, the BPSG oxide film, the USG oxide film, the PSG oxide film, the PETEOS oxide film, or the like.

As the SOG oxide film of a family of HSQ has a good hole gap fill characteristic, additional CMP process and etch processes are not required unlikely from other oxide films. In more detail, it is preferred that the SOG oxide film is deposited by means of the coating method, wherein fluidity oxide (for example, FOX14, FOX15) is used as a coating source liquid and the rotation force upon the coating is about 1500 through 3000 rpm.

The HDP oxide film, the BPSG oxide film, the USG oxide film, the PSG oxide film or the PETEOS oxide film have poor hole gap fill characteristics than the SOG oxide film of a family of HSQ. Thus, it is required that the CMP process and the etch process or the etch process be additionally performed, as shown in FIG. 6A through FIG. 6C. As the methods have been explained in detail by reference to FIG. 6A through FIG. 6C, an explanation on them will be omitted.

Figure 5D:
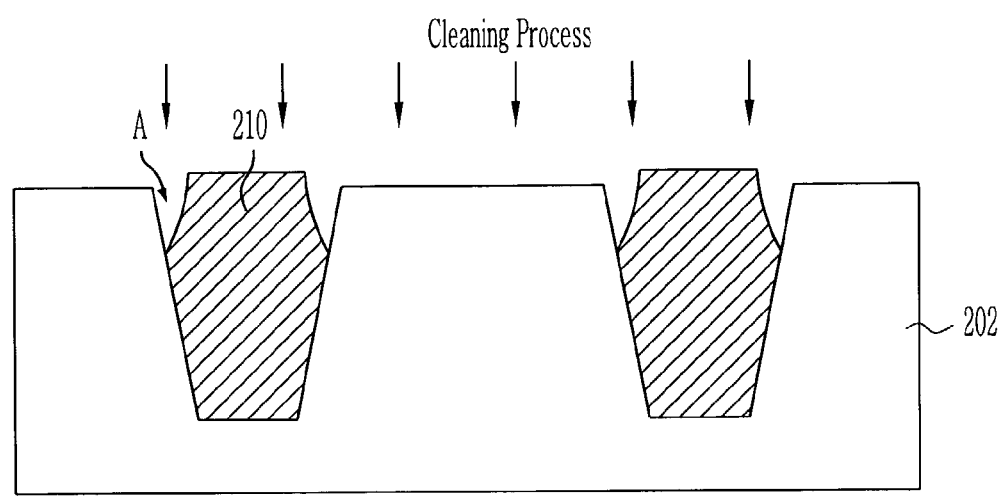

Referring to FIG. 5D, the pad nitride film 204 except for the single insulating film 208 is removed by performing an etch process using the semiconductor substrate 202 as an etch barrier and using phosphoric acid ($H_3PO_4$).

A moat (or recess) is formed at the portion 'A' between the active region of the semiconductor substrate 202 and the single insulating film 208 by means of the wet eth process using DHF or BOE solution. At this time, DHF contains HF of 50% diluted with $H_2O$ at the ratio of 1:99 or 1:500 and BOE contains $NH_4F$ mixed with HF at the ratio of 20:1 or 100:1. The etch size is about in thickness of 500 through 1500 Å. Thereby, the device isolation film 210 consisting of the single insulating film 208 is formed.

Figure 5E:
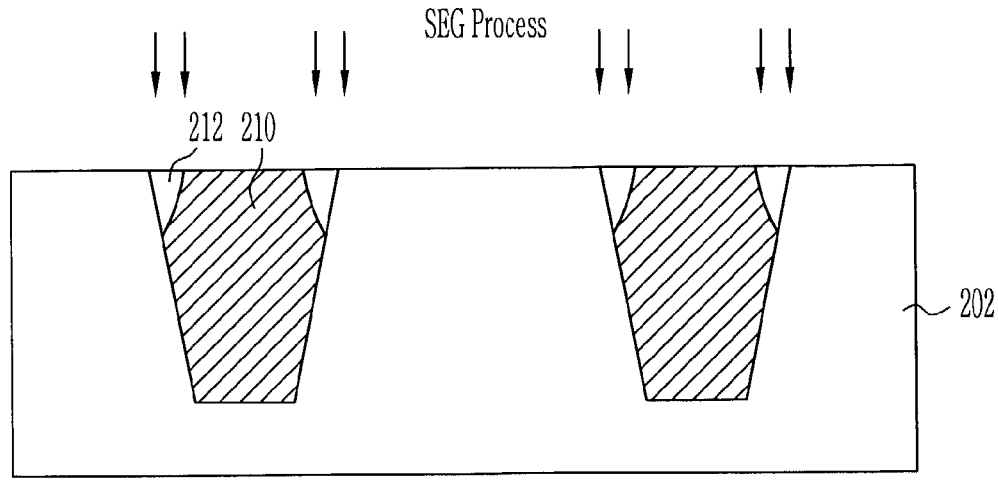

By reference to FIG. 5E, the moat of the semiconductor substrate 202 at the portion 'A' generated in FIG. 5D is grown by the SEG process, thus forming a silicon growth layer 212. The SEG process is performed using DCS ($SiH_2Cl_2$) gas and HCl gas, wherein the amount of the DCS ($SiH_2Cl_2$) gas introduced is 100 through 300 sccm, the amount of the HCl introduced is 20 through 80 sccm, a deposition pressure is 10 through 40 torr and a temperature is 700 through 900° C.

Meanwhile, silicon in the active region on the semiconductor substrate 202 is also grown by the SEG process. Accordingly, the height of the active region of the semiconductor substrate 202 and the height of the device isolation film 208 are kept same. In other words, the height of the device isolation film 210 is higher than that of the semiconductor substrate 202 in FIG. 5D but the heights of the semiconductor substrate 202 and the device isolation film 210 are made same by the SEG process in FIG. 5E.

Subsequent processes, i.e. the process of forming an impurity diffusion layer 224 and a process of forming a gate 222 shown in FIG. 2 are same to those according to the first embodiment of the present invention. A detailed explanation on them will be thus omitted.

As mentioned above, according to the present invention, the minimum marginal width of the impurity diffusion layer is defined to reduce by a given width. The reduced width of the impurity diffusion layer is compensated for through the silicon growth layer formed on the top of the device isolation film having a relatively higher degree of freedom than the bottom of the device isolation film. Therefore, the present invention has an advantageous effect that it can improve the degree of integration in the semiconductor device while keeping intact the minimum marginal width of the impurity diffusion layer.

Further, in the present invention, the silicon growth layer is formed on the inner side of the top having the degree of freedom relatively higher than the width of the bottom while keeping intact the minimum marginal width of the bottom of the device isolation film, so that the area of the impurity diffusion layer can be extended. Thus, the present invention has advantageous effects that it can improve the insulating characteristic of the device isolation film and the degree of integration in the semiconductor device while securing the area of the impurity diffusion layer.

The present invention has been described with reference to a particular embodiment in connection with a particular application. Those having ordinary skill in the art and access to the teachings of the present invention will recognize additional modifications and applications within the scope, thereof.

It is therefore intended by the appended claims to cover any and all such applications, modifications, and embodiments within the scope of the present invention.

What is claimed is:

1. A method of manufacturing a semiconductor device, comprising the steps of:
    (a) forming a pad nitride film on a semiconductor substrate;
    (b) etching a portion of the pad nitride film and the semiconductor substrate to form a trench;
    (c) depositing a first insulating film on the entire structure so that the trench is buried;
    (d) polishing the first insulating film so that the pad nitride film is exposed;
    (e) wet etching the first insulating film so that the semiconductor substrate at both sidewalls of the trench is exposed;
    (f) performing a SEG process at the condition that the pad nitride film is formed on the semiconductor substrate for only the semiconductor substrate exposed at both sidewalls of the trench to form a silicon growth layer on each sidewall;
    (g) forming a second insulating film on the first insulating film so that the trench is buried; and
    (h) removing the pad nitride film.

2. The method as claimed in claim 1, wherein the first insulating film or the second insulating film are formed using any one of a SOG oxide film of a family of HSQ, a HDP oxide film, a BPSG oxide film, an USG oxide film, a PSG oxide film and a PETEOS oxide film.

3. The method as claimed in claim 2, wherein the SOG oxide film of a family of HSQ is formed using a fluidity oxide film as a coating source liquid at the rotating force of 1500 through 3000 rpm.

4. The method as claimed in claim 2, wherein the HDP oxide film is formed using SiH4, O2 and Ar gas or SiH4, O2 and He gas as a source gas, by sequentially performing a deposition process at a temperature of 400 through 700° C. for depositing the HDP oxide film on the entire structure, a CMP process for exposing the semiconductor substrate, and a wet or a dry etch process for exposing a portion of the both inner sidewalls of the trench.

5. The method as claimed in claim 2, wherein the BPSG oxide film is formed using boron and phosphoric having a concentration ratio of 12:4 through 13:6, by sequentially performing a CVD process at a temperature of 400 through 500° C. for depositing the BPSG oxide film, a CMP process for exposing the semiconductor substrate, and a wet or a dry etch process for exposing a portion of the both inner sidewalls of the trench.

6. The method as claimed in claim 2, wherein the USG oxide film is formed using TEOS and O3 gas, by sequentially performing a deposition process at a temperature of 400 through 600° C. for depositing the BPSG oxide film, a CMP process for exposing the semiconductor substrate, and a wet or a dry etch process for exposing a portion of the both inner sidewalls of the trench.

7. The method as claimed in claim 1, wherein the SEG process is performed using DCS(SiH2Cl2) gas and HCl gas, wherein the amount of the DCS(SiH2Cl2) gas introduced is 100 through 300 sccm, the amount of the HCl introduced is 20 through 80 sccm, a deposition pressure is 10 through 40 torr and a temperature is 700 through 900° C.

* * * * *